United States Patent
Fang et al.

(10) Patent No.: US 11,581,161 B2
(45) Date of Patent: Feb. 14, 2023

(54) SYSTEMS AND METHODS FOR ETCHING A SUBSTRATE

(71) Applicant: ASML Netherlands B.V., Veldhoven (NL)

(72) Inventors: Jie Fang, San Jose, CA (US); Yixiang Wang, Fremont, CA (US); Qirong Zhang, Beijing (CN); Haojie Zhang, Beijing (CN); Jinmei Yang, Beijing (CN); Fenghui Zhu, Beijing (CN)

(73) Assignee: ASML Netherlands, B.V., Veldhoven (NL)

( * ) Notice: Subject to any disclaimer, the term of this patent is extended or adjusted under 35 U.S.C. 154(b) by 438 days.

(21) Appl. No.: 16/727,706

(22) Filed: Dec. 26, 2019

(65) Prior Publication Data

US 2020/0211817 A1 Jul. 2, 2020

Related U.S. Application Data

(60) Provisional application No. 62/785,106, filed on Dec. 26, 2018.

(51) Int. Cl.
*H01J 37/26* (2006.01)
*C25F 3/14* (2006.01)

(52) U.S. Cl.
CPC .............. *H01J 37/265* (2013.01); *C25F 3/14* (2013.01); *H01J 2237/0455* (2013.01)

(58) Field of Classification Search
CPC ...... H01J 37/04; H01J 37/0456; H01J 37/265; H01J 2237/0455
See application file for complete search history.

(56) References Cited

U.S. PATENT DOCUMENTS

| 5,049,460 A | * | 9/1991 | Benecke | ............... H01J 37/09 430/323 |
| 2013/0181140 A1 | * | 7/2013 | Parker | ............... H01J 37/09 427/122 |

FOREIGN PATENT DOCUMENTS

| JP | S6081751 A | | 5/1985 |
| JP | S6081751 A | * | 5/1989 |
| JP | 2009-239174 A | | 10/2009 |
| JP | 2009239174 A | * | 10/2009 |
| TW | 2004-23218 A | | 11/2004 |
| TW | 2017-19274 A | | 6/2017 |

OTHER PUBLICATIONS

International Search Report issued in related PCT International Application No. PCT/EP2019/084827, dated Apr. 9, 2020 (3 pgs.).
Office Action and Search Report issued by the Intellectual Property Office (IPO) of Taiwan Patent Application No. 108146910, dated Feb. 19, 2021 (10 pgs.).

* cited by examiner

*Primary Examiner* — David E Smith
(74) *Attorney, Agent, or Firm* — Finnegan, Henderson, Farabow, Garrett & Dunner, LLP

(57) ABSTRACT

A method of processing a workpiece may include forming a first layer on a first side of a base layer. The base layer may be part of a substrate including a plurality of layers. The method may also include forming a second layer on the first layer. A material of the second layer may include metal. The method may also include forming an opening in the second layer, forming an opening in the first layer by etching, and removing the second layer. The method may include dry etching of the first layer.

15 Claims, 10 Drawing Sheets

SYSTEMS AND METHODS FOR ETCHING A SUBSTRATE

CROSS-REFERENCE TO RELATED APPLICATIONS

This application claims priority of U.S. application 62/785,106 which was filed on Dec. 26, 2018, and which is incorporated herein in its entirety by reference.

TECHNICAL FIELD

The embodiments provided herein relate to systems and methods for processing a surface of a workpiece, and more particularly, to using metal as an etching mask, and performing electrochemical etching on a workpiece. Embodiments may be applicable for processes of forming microfeature apertures, such as an aperture array in an electron microscopy apparatus, for example.

BACKGROUND

In manufacturing processes for integrated circuits (ICs), a variety of structures may be formed on a wafer. For example, wire traces, vias, transistors, capacitors, diodes, etc. may be formed on an IC chip. With the trend of increased computing power, packing density of IC components may be increased, or features may be further miniaturized. Accordingly, it is increasingly important to ensure that IC components are manufactured without defects to ensure yield. Forming miniaturized features on a wafer may involve complex processes with numerous individual steps. Errors in even one step may have the potential to dramatically affect the functioning of the final product. For example, pattern defects, uninvited particles (residuals), or the like may appear on a wafer or a mask during fabrication, and may thereby reduce yield. Modern day ICs are increasingly sensitive to defects, and thus, it is increasingly important to form structures free of defects.

A manufacturing process may include etching. Etching is a way to remove material from a wafer surface and may be useful for forming certain structures, such as holes, trenches, or vias, etc. In an etching process, an etchant may attack features on a wafer that are exposed. Thus, a mask may be used to cover features that should not be etched. Typically, a light-sensitive organic material, such as a photoresist, is used as a mask to transfer a pattern to a wafer. Upon selective illumination, part of the photoresist that is exposed may be cured, as in a negative photoresist, or is made more soluble to a developer, as in a positive photoresist. The wafer may be exposed to a developer solution and part of the photoresist may be removed. Then, the wafer may be etched in the locations that are not covered by the photoresist.

Etching may include wet etching or dry etching. In dry etching, such as ion beam etching (IBE), a wafer surface may be bombarded by high energy particles. When etching a wafer that is covered by a mask formed by photoresist, the photoresist may leave residues on the wafer surface. For example, photoresist that is bombarded by an ion beam may become hardened and may leave organic residue on the surface of the wafer even after development. Residue may have adverse effects on the resulting structures formed by etching. For example, in an aperture structure to be used with an electron beam inspection (EBI) tool, residues may cause charged particles to scatter near edges of aperture holes. This may be a killer defect for an e-beam aperture.

Thus, an improvement in way of manufacturing holes, such as apertures, is desired.

SUMMARY

Embodiments of the present disclosure may provide a method of processing a workpiece. The method may include forming a first layer on a first side of a base layer. The base layer may be part of a substrate including a plurality of layers. The method may also include forming a second layer on the first layer. A material of the second layer may include metal. The method may also include forming an opening in the second layer, forming an opening in the first layer by etching, and removing the second layer. The method may include dry etching of the first layer.

In some embodiments, the method may further include forming a mask layer on the second layer, forming an opening in the mask layer, and etching the second layer through the mask layer. Etching the second layer through the mask layer may refer to applying an etchant to the workpiece in a state where the mask layer is still on the workpiece. A material of the mask layer may include photoresist.

In some embodiments, the method may further include forming an opening in the base layer. The opening in the base layer may be larger than the opening in the first layer. Forming the opening in the base layer may include forming a third layer on a second side of the base layer. The second side may be opposite to the first side. The method may further include forming an opening in the third layer and etching the base layer through the third layer. Etching the base layer through the third layer may refer to applying an etchant to the workpiece in a state where the third layer is still on the workpiece. The third layer may refer to a shelter material.

Embodiments of the present disclosure may also provide a workpiece obtained by a method including forming a first layer on a first side of a base layer, forming a second layer on the first layer, forming an opening in the second layer, forming an opening in the first layer by etching, and removing the second layer.

Embodiments of the present disclosure may also provide an aperture obtained by a method including forming a first layer on a first side of a base layer, forming a second layer on the first layer, forming an opening in the second layer, forming an opening in the first layer by etching, removing the second layer, and forming an opening in the base layer. The opening in the base layer may be larger than the opening in the first layer.

Embodiments of the present disclosure may also provide a method of forming an opening in a workpiece. The workpiece may be a precursor structure that includes a first layer on a first side of a base layer, the first layer including a first opening, and a second layer on a second side of the first layer, the second side being opposite the first side and second layer including a second opening. The method may include forming an opening in the base layer by electrochemical etching. The first layer may refer to a metal layer, and the second layer may refer to a shelter material.

Exemplary advantages and effects of the present invention will become apparent from the following description taken in conjunction with the accompanying drawings wherein certain embodiments of the present invention are set forth by way of illustration and example.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of systems, apparatuses, and methods consistent with aspects related to the invention as recited in the appended claims. Relative dimensions of components in drawings may be exaggerated for clarity.

Figure 4:
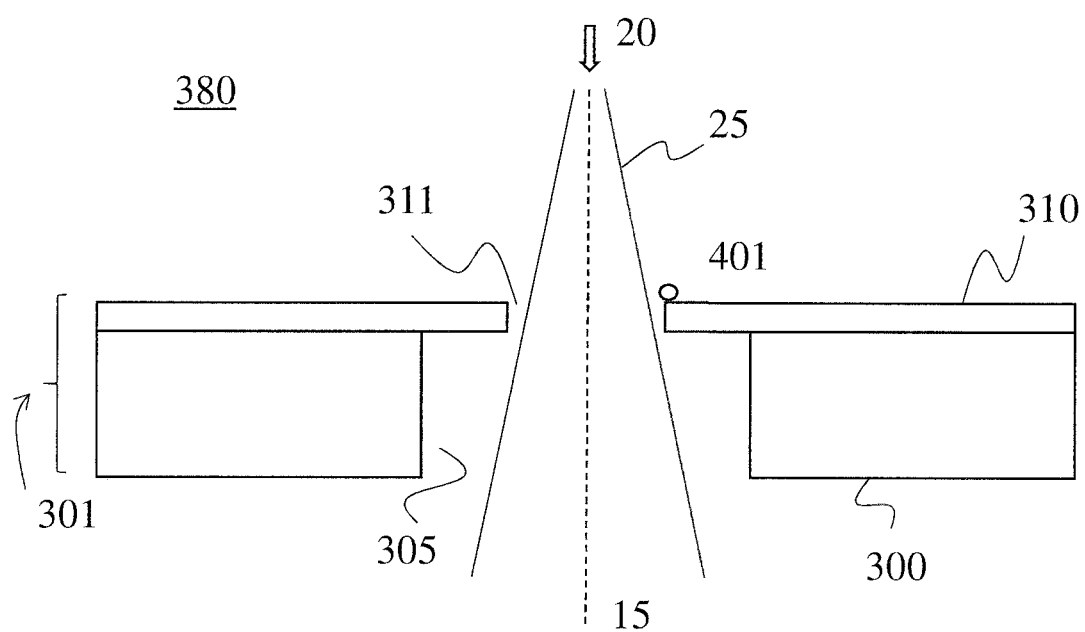
FIG. 4 illustrates a structure that may be used as aperture, consistent with embodiments of the present disclosure.

In manufacturing some features for use in IC chips, or other microstructures, it may be desired to form a hole structure that has an undercut. For example, FIG. 4 shows a substrate 301 with one layer having an opening, and another layer having a larger opening. This structure may allow a beam 25 to pass through without striking sidewalls of the supporting structure.

To form such a structure, a process of forming two holes in a workpiece having several layers may be used. A first hole in the top layer may be formed separately from forming a second hole in the bottom layer. When forming the first hole in the top layer, a known process of using photolithography may be used. Photolithography involves using light to transfer a pattern through a mask to a surface. Photolithography is used in many semiconductor manufacturing processes. In a typical photolithography process, a light-sensitive material, such as a photoresist material, is spread on the surface of the workpiece. Then, a mask having a particular geometric shape is aligned with the workpiece. Light is then projected onto the workpiece and, because some light is blocked by the mask, the geometric shape of the mask is projected onto the photoresist. The photoresist reacts with light and may cause exposed portions to solidify. Then, non-solidified portions of the photoresist may be removed.

Figure 3:
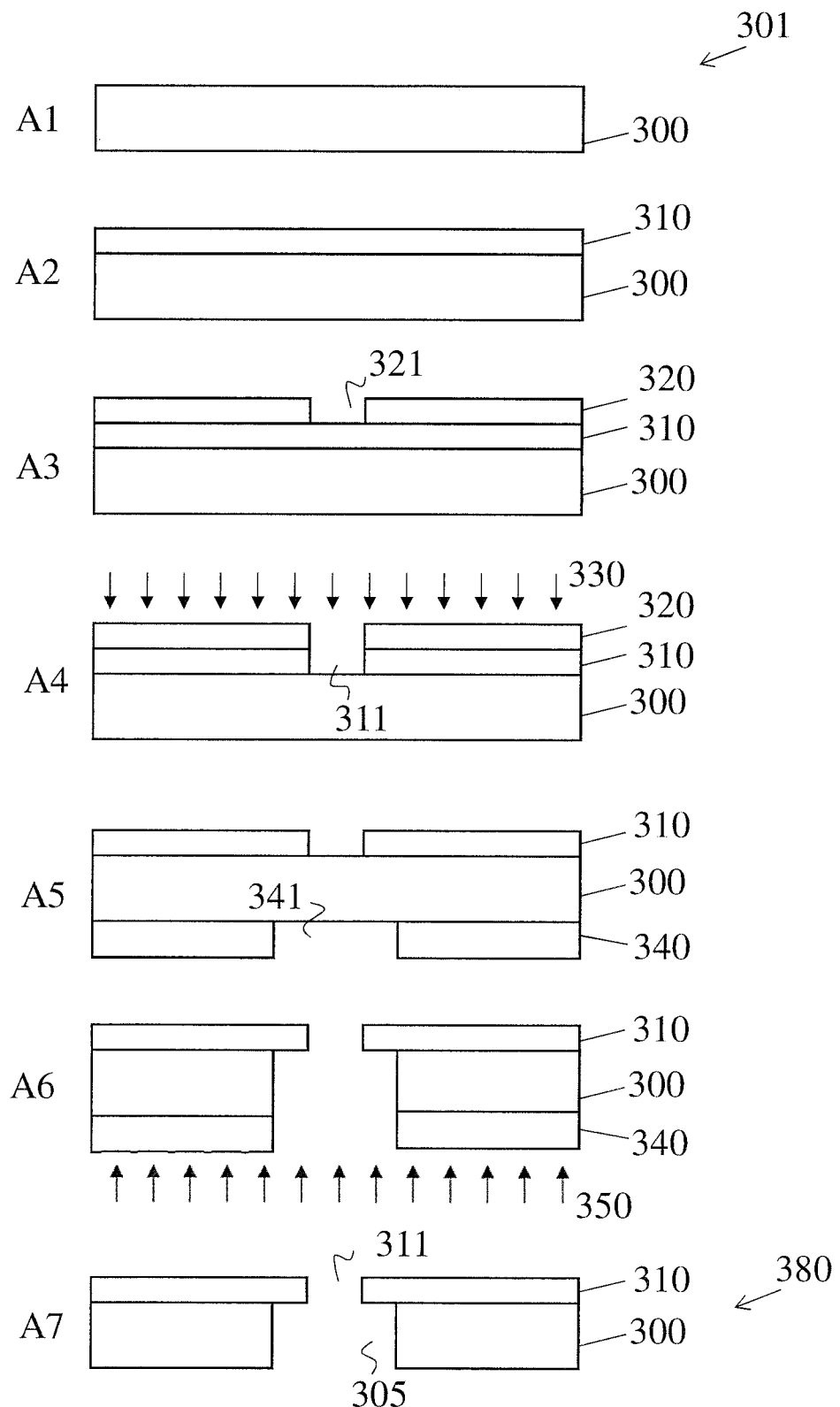
FIG. 3 illustrates an exemplary method of forming a first opening and a second opening in a workpiece, consistent with embodiments of the present disclosure.

In forming the double hole structure in a workpiece, photolithography may be used to provide a layer on top of the workpiece that is used as an etching mask. The etching mask, like a photolithography mask, may block covered areas from exposure to an agent that reacts with the underlying surface. The etching mask may be made of photoresist material. For example, in step A4 as shown in FIG. 3, mask layer 320 blocks an etching agent (ion beam 330) from covered portions of first metal layer 310, allowing an opening 311 to be etched in first metal layer 310 while other portions of first metal layer 310 remain intact.

However, when using photoresist material during an etching process, a residue may be left on the underlying layer. For example, in step A4 of FIG. 3, exposure of mask layer 320 to ion beam 330 may cause part of mask layer 320 to harden. Hardened portions of mask layer 320 may be difficult to remove, and thus, residue (such as residue 401 as shown in FIG. 4), may be left on first metal layer 310. Such residues may lead to defects, which should be avoided.

Figure 5:
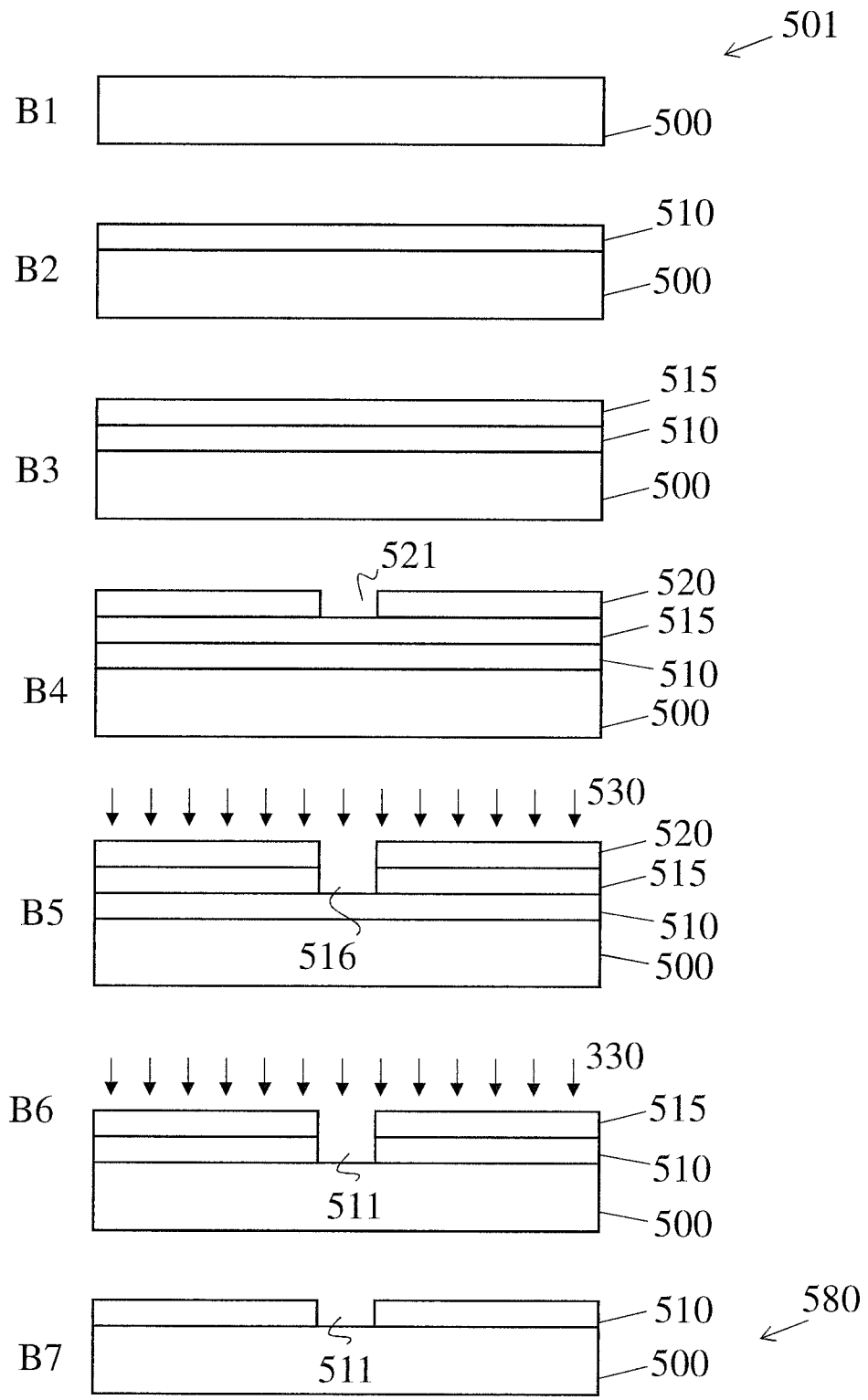
FIG. 5 illustrates an exemplary method of forming an opening in a workpiece, consistent with embodiments of the present disclosure.

According to embodiments of the present disclosure, an improved method of forming holes in a workpiece having several layers may be used. In some embodiments, an extra layer may be provided between a first metal layer and a mask layer. For example, as shown in FIG. 5, at step B4, there is a second metal layer 515 provided between first metal layer 510 and mask layer 520. The extra layer may act as an etching mask and may be more resistant to forming residue than a layer of photoresist material. Accordingly, a structure with a clean round hole may be formed. For example, an opening 511 may be formed in first metal layer 515. A workpiece having such a hole structure may be useful in, for example, forming an aperture device. An aperture device may be used in, for example, an electron beam inspection tool.

Figure 8:
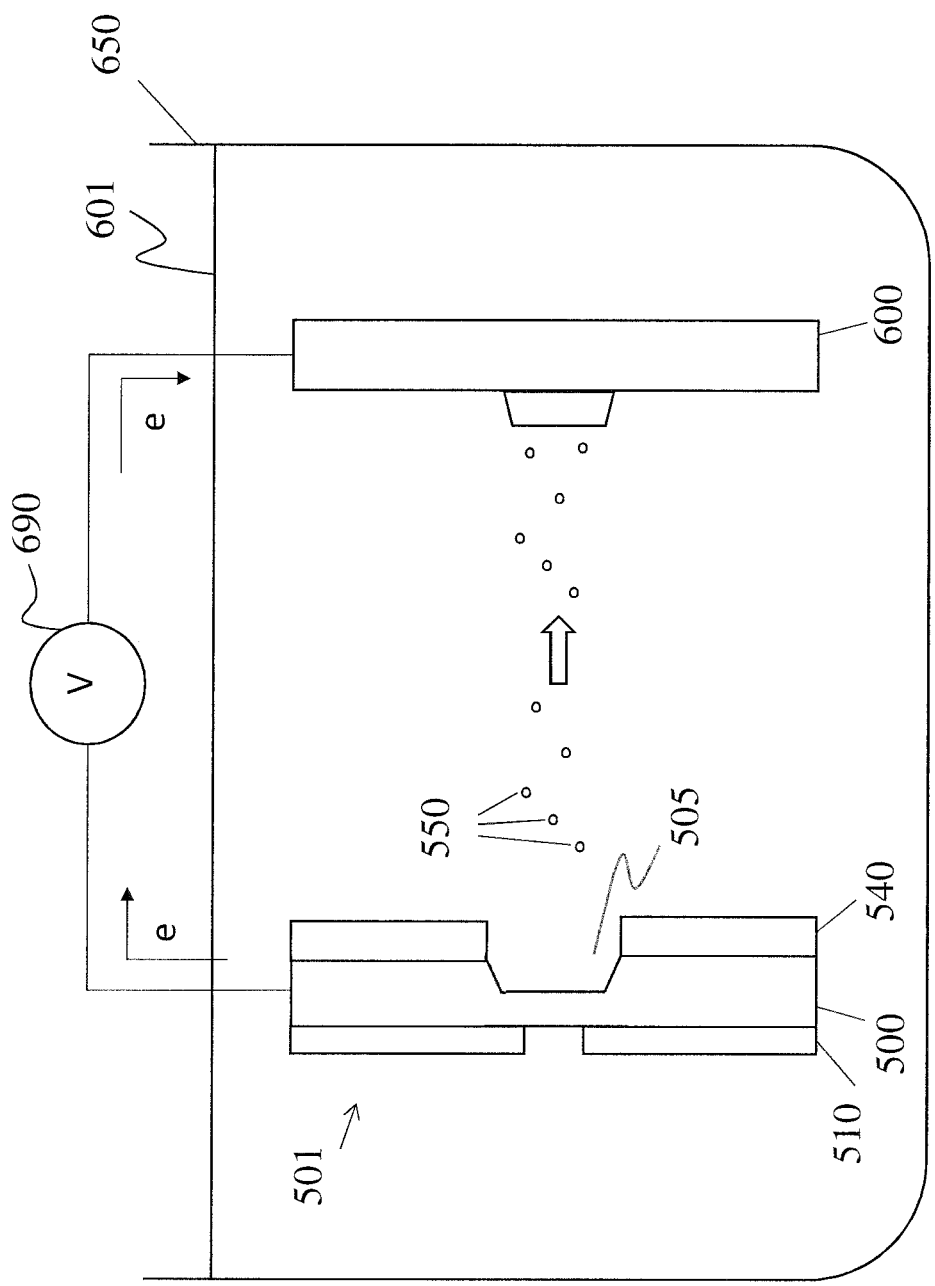
FIG. 8 illustrates an exemplary arrangement of an electrochemical etching process, consistent with embodiments of the present disclosure.

Furthermore, in some embodiments, electrochemical etching may be used to form a hole in a base layer of a workpiece. For example, as shown in FIG. 8, electrochemical etching may be used to remove material from base layer 500 to form opening 505. A structure formed using electrochemical etching may have improved structural strength, reproducibility, and uniformity, which may be significant for applications in electron beam microscopy, among other things.

Without limiting the scope of the present disclosure, descriptions and drawings of embodiments may exemplarily refer to electron beams. However, the embodiments are not used to limit the present invention to specific charged particles. For example, apertures for use with electron beams may similarly be applied to beams of photons, x-rays, and ions, etc.

As used herein, unless specifically stated otherwise, the term "or" encompasses all possible combinations, except where infeasible. For example, if it is stated that a component includes A or B, then, unless specifically stated otherwise or infeasible, the component may include A, or B, or A and B. As a second example, if it is stated that a component includes A, B, or C, then, unless specifically stated otherwise or infeasible, the component may include A, or B, or C, or A and B, or A and C, or B and C, or A and B and C.

Figure 1A:
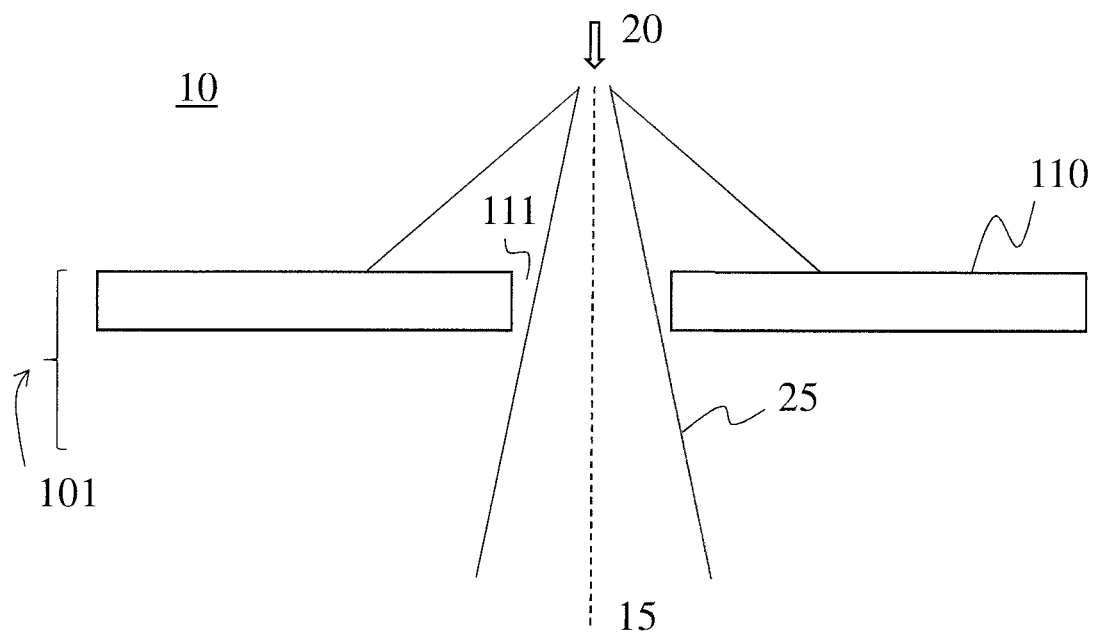
FIG. 1A is a schematic diagram illustrating an exemplary aperture.

Reference is now made to FIG. 1A, which illustrates an exemplary aperture, consistent with embodiments of the present disclosure. An aperture 10 may include a substrate 101. The substrate may be a planar structure that may include a plurality of layers. The layers may extend in a two-dimensional plane perpendicular to a thickness direction of substrate 101. The thickness direction of substrate 101 may be parallel to an axis 15. Substrate 101 may be formed with metallic material. In some embodiments, substrate 101 may be formed with semiconductor material. In some embodiments, substrate 101 may be formed with only one layer.

Substrate 101 of aperture 10 may include plate 110 that is formed with a hole 111. Hole 111 may be circular. Hole 111 may extend through plate 110 in a direction parallel to axis 15. Hole 111 may be aligned with axis 15.

In some embodiments, aperture 10 may be used to limit sizes of an incident beam. For example, a beam 20 may travel along axis 15. Beam 20 may be a beam of charged particle, photons, x-rays, or the like. Beam 20 may be generated by a source, such as a charged particle source that is configured to emit charged particles along an optical axis. A charged particle source, such as an electron gun, may be configured to emit electrons along axis 15. In some embodiments, beam 20 may travel through lenses, deflectors, or other elements before reaching aperture 10. For example, beam 20 may be shaped by optical elements to be a collimated beam. In some embodiments, such as that shown in FIG. 1A, beam 20 may include a diverging beam. Beam 20 may also include a converging beam. Aperture 10 may shape beam 20 into a beam 25 by blocking some portions of beam 20 from travelling through hole 111.

Figure 1B:
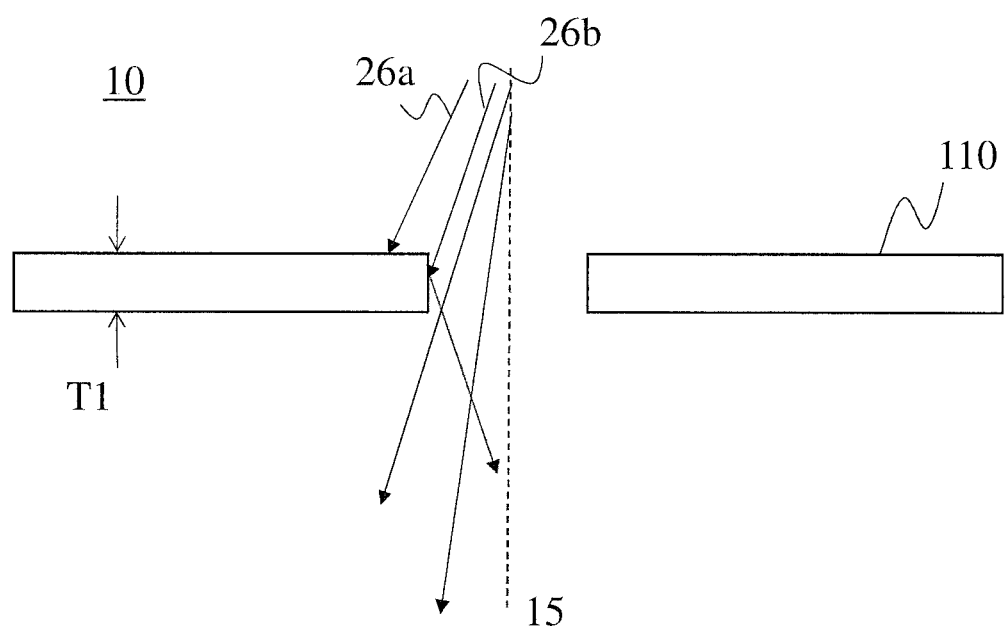
FIG. 1B illustrates individual charged particles of a beam travelling through an aperture such as that of FIG. 1A.

As shown in FIG. 1B, beam 20 may include individual charged particles 26a, 26b, and so on. In some embodiments, aperture 10 may be used as a trimming aperture. Aperture 10 may trim a portion of the charged particles making up beam 20 that will eventually not be used to form probe spots for illuminating a sample. For example, aperture 10 may cut off some of the charged particles of beam 20 to limit a beam current. Aperture 10 may be used to form beamlets from beam 20, and beamlets may be formed to have a desired shape or size. In some embodiments, it may be desired to form beamlets with a particular shape or a particular current. Thus, for some applications, it may be desirable to use aperture 10 having hole 111 that is a particular size, and that is as round as possible. It may be desirable to form hole 111 as a perfect circle with a predetermined diameter.

An aperture may distort a beam or degrade ultimate imaging quality of a particle-optical system. For example, aperture 10 may introduce stigmatism. The greater the thickness of aperture plate 110, the greater the stigmatism may be. FIG. 1B shows an exemplary tunneling effect. Plate 110 may have some finite thickness. For example, plate 110 may be formed as a planar layer having a uniform thickness T1. Hole 111 in plate 110 may have sidewalls extending in the thickness direction. Individual charged particles in beam 20 may be affected by structures of plate 110. For example, some charged particles may strike side walls of hole 111 and be reflected. As shown in FIG. 1B, charged particle 26b may have its trajectory altered when traveling through aperture 10. Accordingly, it may be desirable to form plate 110 to be as thin as possible.

Decreasing the thickness of a planar layer to be used as an aperture may involve a number of issues. For example, with decreased thickness, there may be a corresponding reduction in structural strength and durability. It may be desirable to form an aperture that withstands various stresses acting on it. For example, an aperture may need to withstand high incidence of an incoming beam without experiencing deformation above a certain threshold. A beam that is incident on an aperture plate may cause high heat to be generated in the aperture plate due to absorbance of charged particles. However, when an aperture plate is made too thin, areas around edges of an aperture hole may begin to deviate from being flat due to stresses or other factors. That is, a planar layer that forms an aperture plate may have portions that deviate from being in-plane. For example, areas near edges around an aperture hole may become wavy, or flower-shaped.

In some embodiments, an aperture may include an aperture plate and a supporting layer. The supporting layer may support the aperture plate and provide structural strength. The supporting layer may be adjacent the aperture plate and, in some embodiments, may directly contact the aperture plate. The supporting layer may be formed in a manner so that there is an undercut in the aperture. By using a supporting layer, thickness of a top planar layer that forms an aperture plate may be made thinner.

Figure 2A:
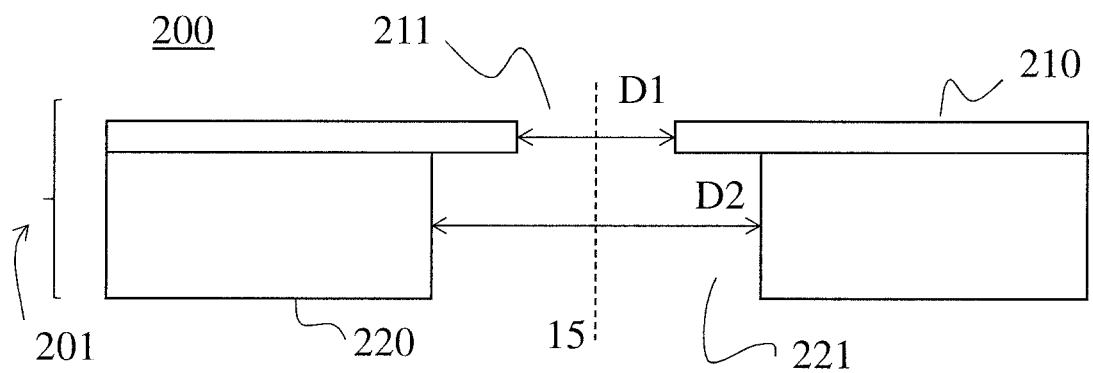
FIGS. 2A to 2C are views of an exemplary configurations of an aperture, consistent with embodiments of the present disclosure.

FIG. 2A illustrates an exemplary aperture, consistent with embodiments of the present disclosure. As shown in FIG. 2A, an aperture 200 may be provided that includes a substrate 201 including a plurality of layers. Substrate 201 may include an aperture plate 210 and a supporting layer 220. Aperture plate 210 may be stacked on top of supporting layer 220. Aperture plate 210 may include first hole 211, and supporting layer 220 may include second hole 221. Aperture 200 may be aligned with axis 15 that may be collinear with an optical axis of a charged particle beam. Because a beam travelling through aperture 200 may include a diverging beam, supporting layer 220 may be formed in a manner so that an undercut is formed in aperture 200. A size of first hole 211 may be less than that of second hole 221. Therefore, an expanding beam that passes through first hole 211 may continue to expand without hitting the side walls of second hole 221. In some embodiments, a transition between aperture plate 210 and supporting layer 220 may include a sharp corner. For example, side walls of second hole 221 may be parallel to axis 15 so that a 90-degree corner is formed on the side of aperture plate 210 that faces supporting layer 220. In some embodiments, the transition between aperture plate 210 and supporting layer 220 may include a smooth curve.

First hole 211 may be formed with a diameter D1 that is less than a diameter D2 of second hole 221. Diameter D2 may be specified based on a predetermined ratio. That is, a ratio D2/D1 may bet set in advance. The ratio D2/D1 may be set based on a degree of focusing of beam 20. In some embodiments, the ratio D2/D1 may be set within a range of 1.5 to 5, for example.

Figure 2B:
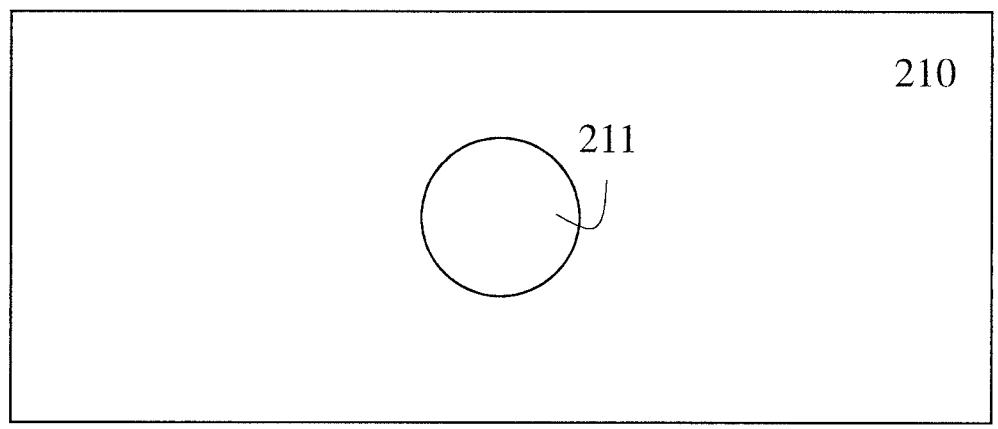

FIG. 2B is a top view of aperture 200 as viewed from a top side. As shown in FIG. 2B, from the top side of aperture 200, there is provided aperture plate 210 having first hole 211. A beam that passes through aperture 200 may be directed into the page in the view of FIG. 2B.

Figure 2C:
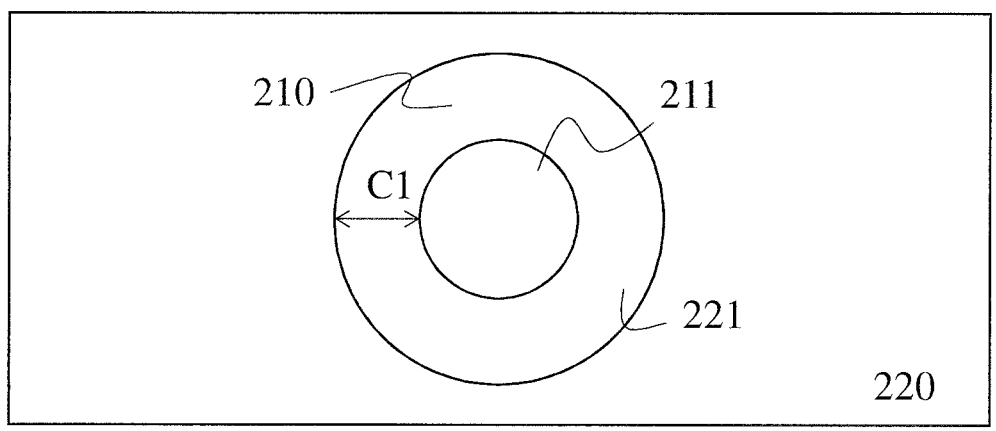

FIG. 2C is a bottom view of aperture 200 as view from a bottom side. A beam that passes through aperture 200 may be directed out of the page in the view of FIG. 2C. As shown in FIG. 2C, from the bottom side of aperture 200, supporting layer 220 and aperture plate 210 may be visible. Supporting layer 220 may be provided with second hole 221 having a size larger than first hole 211 by an amount equal to C1. That is, a distance from an edge of first hole 211 to an edge of second hole 221 may be given by the dimension C1. Dimension C1 may be constant around an entire circumference of first hole 211 and second hole 221. In some embodiments, dimension C1 may be have a variance less than or equal to a predetermined value. For example, dimension C1 may vary no more than 30% around the entire circumference of first hole 211 and second hole 221.

Supporting layer 220 may be provided having a predetermined thickness and a predetermined value of dimension C1. Second hole 221 that is provided a distance C1 from the edge of first hole 211 may provide a clearance space so that a beam passing through may continue to expand. Furthermore, second hole 221 may be provided distance C1 away from the edge of first hole 211 so that charged particles of a beam passing through first hole 211 are prevented from interacting with side walls of second hole 221. There may be a minimum value of C1 so that second hole 221 does not interfere with a beam passing through aperture 200. The minimum value of C1 may be based on, for example, imaging effects on a beam. The minimum value of C1 may be set based on a size of first hole 211. For example, C1 may be a multiple of diameter D1 of first hole 211, such as 0.5. In some embodiments, the minimum value of C1 may be set within a range of 0.1 to 2.5 times diameter D1 of first hole 211.

Meanwhile, supporting layer 220 may provide mechanical support for aperture plate 210. The greater the amount of material constituting supporting layer 220, the greater the mechanical support may be. Furthermore, the closer supporting layer 220 comes to first hole 211, the greater the mechanical support may be. Thus, in consideration of mechanical support, it may be desirable to set a value of C1 as small as possible so that more material is provided around first hole 211.

There may be a tradeoff relationship between providing mechanical support to aperture plate 210 and avoiding influence on a beam passing through aperture 200. Thus, a value of C1 may be determined based on predetermined criteria that take into account beam influence and mechanical support. In some embodiments, a value of C1 may be set to a constant value. For example, a value of C1 may be set to 50 μm. In some embodiments, a value of C1 may be set within a range, such as 25 μm to 100 μm.

A process of forming first hole 211 and second hole 221 may include mechanical processing, chemical processing, or other methods of removing material. For example, a method of forming a hole may comprise using a drill, laser, and the like. However, mechanical methods of removing material, such as drilling, may have negative effects on the resulting geometry of a hole. For example, a hole may be formed with a jagged edge or other imperfections. A hole having imperfections may deviate from a desired shape, such as that of a perfect circle. Furthermore, a hole having imperfections may result in an aperture plate that deviates from a flat, planar shape. Holes that are formed with imperfections may have adverse effects when used as an aperture for a beam. For example, imperfections may influence charged particles of a beam travelling through the aperture.

In some embodiments, aperture 200 having first hole 211 and second hole 221 may be formed by lithography, etching, or other processes. A method of forming first hole 211 and second hole 221 will now be described with reference to FIG. 3.

As shown in FIG. 3, in step A1, a base layer may be provided that makes up a portion of a substrate 301. For example, base layer 300 may be provided. In some embodiments, the aperture is used to limit the electron current in an e-beam inspection system, where it is important that the aperture materials have minimal thermal expansion and so the hole size can be precisely preserved despite the heating effect from electron bombardment.

Base layer 300 may be a single monolithic material. The material of base layer 300 may be a metal, such as molybdenum. Base layer 300 may be a flat molybdenum plate. The molybdenum plate may be mechanically rolled, and may have high strength and surface roughness. Step A1 may include polishing the molybdenum sheet. Step A1 may include performing stress relief. For example, step A1 may include annealing of base layer 300.

Step A1 may include further surface processing steps. For example, step A1 may include removing surface organic matter or other particle contamination. Step A1 may include chemical etching. Step A1 may include ultrasonic etching that may follow chemical etching. Prior to applying another layer to base layer 300, step A1 may include removing water vapor from the surface of base layer 300.

In step A2, a first metal layer 310 may be provided on top of base layer 300. First metal layer 310 may be applied to the top of base layer 300 by sputtering, for example. In some embodiments, an adhesion layer may be applied prior to providing first metal layer 310 on base layer 300. The material of first metal layer 310 may be platinum, for example. An adhesion layer may include titanium, for example. First metal layer 310 may be used to form an aperture plate. Thickness of first metal layer 310 may be determined based on criteria for an aperture. In some embodiments, the thickness of first metal layer 310 may be less than or equal to 1.4 μm. In some embodiments, the thickness of first metal layer 310 deposited on base layer 300 may be set at, for example, 0.2 to 1.5 μm. In some embodiments, the thickness of first metal layer 310 may be 0.5 μm.

In step A3, a mask layer 320 may be provided on top of first metal layer 310. Step A3 may include applying and patterning a photoresist on first metal layer 310. Providing mask layer 320 may include coating a film of photoresist material on first metal layer 310, heating substrate 301, and transferring a pattern to the photoresist by photolithography. Heating of the substrate before performing photolithography may have a significant influence on the roundness of small holes. After performing photolithography, further processing may be performed. For example, post-baking and development may be performed. As shown in FIG. 3, at step A3, mask layer 320 may be formed with an opening 321 that may be formed by photolithography. Opening 321 may include a hole having round edges.

In step A4, a dry etching process may be performed. Dry etching may include ion beam etching (IBE) and may be an anisotropic process. Step A4 may include applying an ion beam 330 to the top surface of first metal layer 310. Mask layer 320 may be formed with Opening 321, and thus, portions of first metal layer not covered by mask 320 may be etched away. Etching may proceed until the entire thickness of first metal layer 310 is etched through, thereby forming an opening 311 in first metal layer 310. Opening 311 may include a hole having round edges. In some embodiments, ion beam 330 may be a collimated beam that is perpendicularly incident on substrate 301. In some embodiments, ion beam 330 may be applied at an angle to substrate 301. For example, ion beam 330 may be directed toward substrate 301 at a 30-degree angle with respect to the thickness direction of substrate 301. Substrate 301 may be rotated during exposure while ion beam 330 is applied at an angle. For example, substrate 301 may be rotated at 25 rpm.

In step A5, mask layer 320 may be removed. Step A5 may include a wet method or a dry method of development. Step A5 may include using a developer, such as acetone, to remove mask layer 320. In some embodiments, inductively coupled plasma etching (ICP) may be used to remove photoresist that may be included in mask layer 320.

Step A5 may also include providing a shelter material 340 on a bottom side of base layer 300. In step A5, substrate 301 may be flipped over so that processing may be performed on the opposite side of base layer 300 from that adjacent to first metal layer 310. Providing shelter material 340 may include applying and patterning a photoresist on base layer 300. Providing shelter material 340 may include coating a photoresist material on base layer 300, heating substrate 301, and transferring a pattern to the photoresist by photolithography, similar to that discussed above for mask layer 320. Before or after performing photolithography, further processing may be performed, such as pre-baking or post-baking. As shown in FIG. 3, at step A5, shelter material 340 may be formed with an opening 341 that may be formed by photolithography. Opening 341 may include a hole having round edges. Opening 341 may be larger than opening 311 formed in first metal layer 310. For example, a round hole that may be included in opening 341 may have a diameter larger than that of a round hole that may be included in opening 311.

In step A6, a wet etching process may be performed. Wet etching may include chemical etching and may be an isotropic process. Step A6 may include applying chemical etchant 350 to the bottom surface of base layer 300. Chemical etchant 350 may include an acid or mordant. Shelter material 340 may be formed with opening 341, and thus, portions of base layer 300 not covered by shelter material 340 may be etched away. Etching may proceed until the entire thickness of a portion of base layer 300 is etched through, thereby forming an opening 305 in base layer 300. Opening 305 may communicate with opening 311. Opening 305 may include a clearance hole having round edges around its circumference on the bottom side of substrate 301.

In step A7, shelter material 340 may be removed. Step A7 may include development. Step A7 may include using a developer, such as acetone, to remove shelter material 340. Step A7 may include a process similar to that included in step A5 to remove mask layer 320.

In the process shown in FIG. 3, a structure having a first layer with a first opening and a second layer with a second opening may be formed. The second opening may be larger than the first opening, such that an undercut is formed. The structure formed by the process of FIG. 3 may be used as an aperture 380.

Reference is now made to FIG. 4, which illustrates a structure used as aperture 380, consistent with embodiments of the present disclosure. Aperture 380 may be similar to aperture 10, discussed above with reference to FIG. 1A and FIG. 1B. Aperture 380 may include a planar structure with a plurality of layers extending in a two-dimensional plane perpendicular to a thickness direction. Aperture 380 may be used to limit sizes of an incident beam, such as beam 20 that may travel along axis 15. In comparison to aperture 10, aperture 380 may be formed with first metal layer 310 that may be thinner than plate 110 of aperture 10. As a comparative example, plate 110 of aperture 10 may have thickness T1 of about 7 µm. First metal layer 310 of aperture 380 may have a thickness of about 1 µm or less. Aperture 380 may include base layer 300 that may act as a supporting material. Therefore, first metal layer 310 may be made thinner than a comparable aperture plate that provides its own structural support itself. Because first metal layer 310 may be made thinner, aperture 380 may generate less influence on a beam passing through. For example, a tunneling effect may be reduced.

Aperture 380 produced by a process that involves dry etching a photoresist mask layer may encounter the following issues. For example, when a dry etching process is configured to remove a relatively thick metal layer, the process may cause a mask layer on top of the metal layer to leave residues. In the process of FIG. 3, ion beam 330 may be used to etch first metal layer 310 made of platinum, as in step A4. Ion beam 330 may be applied to the top of, substrate 301, such that beam 330 is incident on mask layer 320. Application of a high energy ion beam to photoresist material that may be included in mask layer 320 may cause mask layer 320 to become hardened. Hardened areas of mask layer 320 may be difficult to remove by wet or dry development processes. For example, after step A4 it may be difficult to completely remove mask layer 320 by developers such as acetone or O2 plasma, and there may be some residue left on top of first metal layer 310. As shown in FIG. 4, residue 401 may be left on first metal layer 310.

Organic residue, such as that produced by photoresist material, may interfere with operation of aperture 380 for shaping beams passing therethrough. For example, residues may cause the shape of an opening to deviate from its intended shape, or may leave an irregular edge. Furthermore, for an e-beam aperture, the aperture surface should be free of contamination such as organic residues so as to prevent influencing the trajectories of electrons through the aperture. In some applications, it may be especially important to keep areas near the edge of aperture holes free of residue.

To reduce the possibility of forming residue, dry etching may be performed to a lesser extent. Accordingly, hardening of photoresist in mask layer 320 may occur to a lesser extent. To do so, thickness of first metal layer 310 may be reduced correspondingly. For example, a thinner first metal layer 310 may be used so that, in step A4, the ion beam strength or exposure time may be reduced. Thus, first metal layer 310 may be etched through to form opening 311 with less time or with weaker exposure of ion beam 330, and mask layer 320 may be prevented from forming residues.

However, it may not be possible to completely prevent the formation of residues from mask layer 320. Furthermore, reduction of the thickness of first metal layer 310 may limit design flexibility and may lead to other design trade-offs.

Another way to reduce the possibility of forming residue may be to use a thicker mask layer 320. For example, in a nominal process according to step A3, mask layer 320 may be formed by coating a 2.5 µm thick layer of photoresist on first metal layer 310. In some embodiments, a thicker layer of photoresist may be provided relative to the nominal process. For example, a 5 µm thick layer of photo resist may be provided as mask layer 320. Accordingly, in step A4, when mask layer 320 is bombarded by ion beam 330, there may be a greater likelihood that only the top portion of mask layer 320 becomes hardened and mask layer 320 can still be removed without leaving residues on first metal layer 310.

However, increasing thickness of mask layer 320 may have detrimental effects on patterning resolution for forming opening 311. For example, thicker mask structures may degrade resolution for forming smaller and more intricate features. Additionally, it may not be possible to completely prevent the formation of residues from mask layer 320 even when increasing the thickness of mask layer 320. Furthermore, increasing the thickness of mask layer 320 may increase complexity and add other complications to the process of FIG. 3.

Some embodiments of the present disclosure may provide a method for forming a structure that may be useful as an aperture, and that may reduce or eliminate formation of residues.

Reference is now made to FIG. 5, which illustrates a method of forming an opening, consistent with embodiments of the present disclosure. The method of FIG. 5 may include forming structures using lithography, etching, or other processes.

In step B1, a base layer 500 may be provided that may make up a part of a substrate 501. Base layer 500 may be a single monolithic material. The material of base layer 500 may be a metal, such as molybdenum. Base layer 500 may be a flat molybdenum plate. Step B1 may be similar to step A1 and may include polishing the molybdenum plate, among other things.

In step B2, a first metal layer 510 may be provided on top of base layer 500. First metal layer 510 may be applied to the top of base layer 500 by sputtering, for example. In some embodiments, an adhesion layer may be applied prior to providing first metal layer 510 on base layer 500. The material of first metal layer 510 may be platinum, for example. An adhesion layer may include titanium, for example. First metal layer 510 may be used to form an aperture plate. Thickness of first metal layer 510 may be determined based on criteria for an aperture, such as a value for achieving a particular amount of beam current limit with acceptable amounts of distortion. In some embodiments, the thickness of first metal layer 510 may be less than or equal to 1.4 µm. In some embodiments, the thickness of first metal layer 510 deposited on base layer 500 may be set at, for example, 0.2 to 1.5 µm. In some embodiments, the thickness of first metal layer 510 may be 0.5 µm. Step 132 may be similar to step A2 and may include similar processing.

In step B3, a second metal layer 515 may be provided on top of first metal layer 510. Second metal layer 515 may be applied to the top of first metal layer 510 by sputtering, for example. Second metal layer 515 may be formed with a material that has different solubility from other layers of substrate 501. The material of second metal layer may be molybdenum, for example. A thickness of second metal layer 515 may be greater than that of first metal layer 510.

In step B4, a mask layer 520 may be provided on top of second metal layer 515. Step 134 may include applying and patterning a photoresist on second metal layer 515. Providing mask layer 520 may include coating a film of photoresist material on second metal layer 515, heating substrate 501, and transferring a pattern to the photoresist by photolithography. Heating of the substrate before performing photolithography may have a significant influence on the roundness of small holes. Step B4 may be similar to step A3 and may include further processing, such as post-baking and development. As shown in FIG. 5, at step B4, mask layer 520 may be formed with an opening 521 that may be formed by photolithography. Opening 521 may include a hole having round edges.

In step B5, a portion of the second metal layer 515 may be removed. Step B5 may include etching, such as a wet chemical etching process. An etchant 530 may be used that attacks the material of second metal layer 515 and does not attack mask layer 520 or first metal layer 510. Etchant 530 may be a chemical solution including an agent that attacks the material of second metal layer 515 more than other parts of substrate 501. In some embodiments, the material of second metal layer 515 may be more soluble to etchant 530 than the material of mask layer 520. Etching may proceed until the entire thickness of second metal layer 515 is etched through, thereby forming an opening 516 in second metal layer 515. Opening 516 may include a hole having round edges. The pattern of mask layer 520 may be transferred to second metal layer 515.

Step B5 may include removing mask layer 520. Removing mask layer 520 may include a wet method or a dry method of development. Etchant 530 may include a developer. In some embodiments, mask layer 520 may be removed together with the etching process that forms opening 516 in second metal layer 515. In some embodiments, mask layer 520 may be removed in a separate step.

In step B6, a dry etching process that may include IBE may be performed. Step B6 may be similar to step A4 and may include similar processing, such as applying ion beam 330 to the top surface of substrate 501. Although mask layer 520 may have been removed, second metal layer 515 may act as a mask. Second metal layer 515 may be formed with opening 516, and thus, portions of first metal layer 510 not covered by second metal layer 515 may be etched away. Etching may proceed until the entire thickness of first metal layer 510 is etched through, thereby forming opening 511 in first metal layer 510. Opening 511 may include a hole having round edges. Ion beam 330 may be a collimated beam that is perpendicularly incident on substrate 501 or that is applied at an angle.

In step B7, second metal layer 515 may be removed. Step B7 may include etching, such as a wet chemical etching process. An etchant may be used that attacks the material of second metal layer 515 and does not attack first metal layer 510. In some embodiments, the material of second metal layer 515 and that of base layer 500 may be the same. Accordingly, some of base layer 500 may be etched away while removing second metal layer 515. However, because further processing may be performed, such as forming an opening on the bottom side of substrate 501, removal of material from base layer 500 that may occur in step B7 may be irrelevant. For example, a clearance hole may be formed from the bottom side of substrate 501, as shall be discussed below, and thus removal of material from base layer 500 around opening 511 may be inconsequential. After step B7, a structure 580 may be formed that is used as a precursor for further processing.

Further processing may include steps similar to or the same as steps A5, A6, and A7, discussed above with respect to FIG. 3, or other processing. For example, after step B7, further processing on structure 580 may include providing a shelter material on the bottom side of substrate 501. Substrate 501 may be flipped over so that processing may be performed on the opposite side of base layer 500 from that having first metal layer 510. A shelter material formed on the bottom of base layer 500 may be patterned by performing photolithography. Thereafter, a wet etching process may be performed. The shelter material on the bottom of base layer 500 may be formed with an opening that may be larger than opening 511, and thus, portions of base layer 500 not covered by the shelter material may be etched away. Etching may proceed until the entire thickness of base layer 500 is etched through, thereby forming a clearance hole in base layer 500. The clearance hole may communicate with opening 511. The shelter material may then be removed by, for example, development.

In the process shown in FIG. 5, a structure having a first layer with a first opening may be formed. After further processing that may be performed on precursor 580, a second opening may be formed. For example, the processing of steps A5, A6, and A7 may be used to form the second opening. The second opening may be larger than the first opening, such that an undercut is formed. The structure formed using the process of FIG. 5 and other processing may be used to form an aperture 590.

Figure 6:
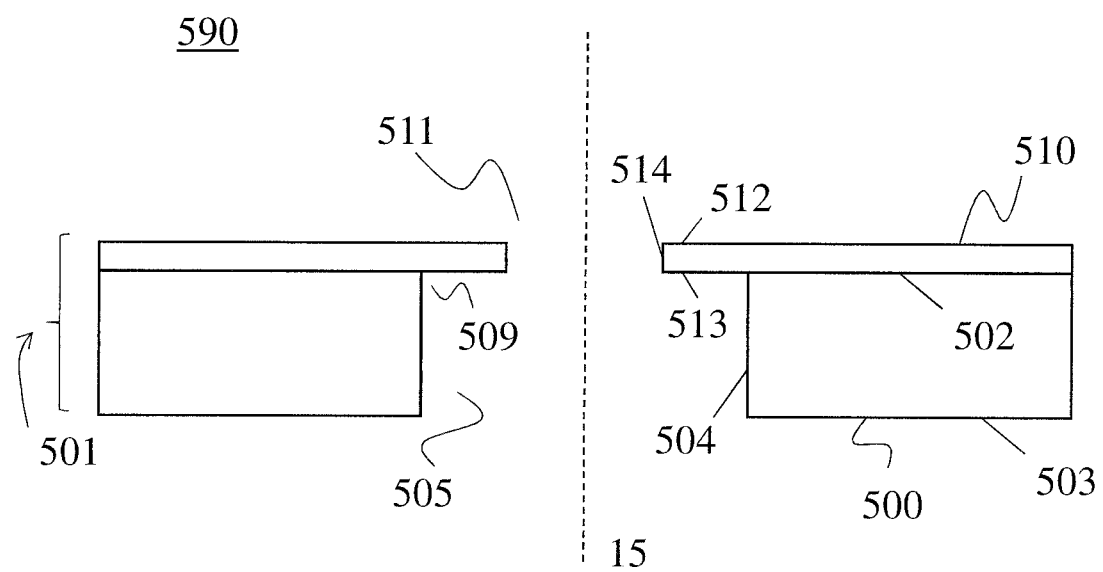
FIG. 6 illustrates a structure that may be used as aperture, consistent with embodiments of the present disclosure.

Reference is now made to FIG. 6, which illustrates aperture 590. Aperture 590 may be formed using the processing as shown in FIG. 5 and other processing, such as steps A5, A6, and A7 of FIG. 3. Aperture 590 may be similar to aperture 200, as shown in FIGS. 2A-2C, except that aperture 590 may avoid formation of residue 401.

Aperture 590 may include substrate 501 that includes a plurality of layers stacked in a thickness direction. The thickness direction of substrate 501 may align with axis 15. Substrate 501 may include first metal layer 510 and base layer 500. First metal layer 510 may act as an aperture plate. Base layer 500 may act as a supporting layer. Base layer 500 may have a first surface 502 and a second surface 503. First surface 502 and second surface 503 may be opposite faces of base layer 500 along the thickness direction of substrate 501. First metal layer 510 may have a first surface 512 and a second surface 513. First surface 512 and second surface 513 may be opposite faces of first metal layer 510 along the thickness direction of substrate 501. First metal layer 510 may be stacked on top of base layer 500 in a manner so that first surface 502 of base layer 500 is adjacent to second surface 513 of first metal layer 510. First surface 502 and second surface 513 may directly contact one another.

First metal layer 510 may include a first opening, such as opening 511. Opening 511 may include a circular hole. Opening 511 may extend completely through first metal layer 510 from first surface 512 to second surface 513. First metal layer 510 may have a sidewall 514 that may be parallel to the thickness direction. Base layer 500 may include a second opening, such as opening 505. Opening 505 may include a clearance hole that may have a circular shape when viewed from a bottom side of substrate 501. Opening 505 may extend completely through base layer 500 from first surface 502 to second surface 503. Base layer 500 may have a sidewall 504 that may be parallel to the thickness direction. In some embodiments, sidewall 504 may form a taper from second surface 503 and gradually narrow until reaching first surface 502. Sidewall 504 may form a smooth curve between second surface 503 and first surface 502. Aperture 590 may be aligned with axis 15 that may be collinear with an optical axis of a charged particle beam. Base layer 500 may be formed with opening 505 that is larger than Opening 511 so that an undercut is formed in aperture 590. Opening 511 may include a circular hole having a diameter smaller than that of a circular hole included in opening 505. A transition between first metal layer 510 and base layer 500 may include a sharp corner 509. Side wall 504 may be vertical between first surface 502 to second surface 503 so that a 90-degree corner is formed where base layer 500 meets first metal layer 510.

In some embodiments, a diameter of opening 511 may be less than 200 µm. The diameter of opening 511 may be 150 µm, 100 µm, 70 µm, 50 µM, 35 µm, or 25 µm, for example. A diameter of opening 505 may be less than 500 µm. The diameter of opening 505 may be 250 µm, 200 µm, 170 µm, 150 µm, 132 µm, or 122 µm, for example.

The material of first metal layer 510 may be different from that of base layer 500. The material of first metal layer 510 may be more resistant to etchant 530 than the material of second metal layer 515. That is, the material of second metal layer 515 may be more soluble to etchant 530 than the material of first metal layer 510. Thus, first metal layer 510 may act as an etch stop for an etching process that etches through second metal layer 515, as in step B5, for example. Solubility may refer to the tendency of a material to break down, dissolve, or otherwise react upon exposure to an etchant, developer, ion beam, etc. The material of first metal layer 510 may be more soluble to ion beam 330 than the material of mask layer 520 or second metal layer 515 (i.e., ion beam 330 attacks metal layer 510 more than mask layer 520 or second metal layer 515). In some embodiments, the solubility of first metal layer 510 and second metal layer 515 to ion beam 330 may be substantially equal. However, because the thickness of second metal layer 515 may be larger than that of first metal layer 510, ion beam 330 may etch through first metal layer 510 to form opening 511 before the thickness of second metal layer 515 is etched through. Remnants of second metal layer 515 may then be removed by further processing, such as wet chemical etching, to which first metal layer 510 may be resistant.

A structure produced by a process that involves wet etching a base layer with a first metal layer formed thereon, such as that of structure 580, may encounter the following issues. For example, wet etching using a chemical etchant is a process that may be sensitive to conditions of the environment, and may exhibit a non-linear etching rate, etc. Environmental conditions may include temperature, humidity, agitation, and so on. Wet etching may also be sensitive to conditions of the solvent, such as concentration, batch consistency, and so on. Achieving high quality, repeatable etching results may require close attention to environmental and solvent conditions, which may add cost and complexity to manufacturing processes. For example, it may be difficult to maintain high environmental standards for a facility and to maintain uniformity of supplies.

Furthermore, wet etching may be sensitive to stochastics of the process itself. For example, by nature, an isotropic wet etching process may result in variable surface topology and etching rate. Therefore, structures produced by wet etching may have low uniformity. The longer the etching process continues, the greater the stochastic variation may become.

Other factors may include morphology and cleanliness of the structure. For example, structure 580 may include opening 511. The size of opening 511 may also affect etching rate. Furthermore, in some wet etching processes, the products of etching may include gases. Thus, outgas bubbles may be formed that may block further etching or reduce transport rate of etchants across the surface to be etched. In the case of opening 511 being a circular hole with a diameter of, for example, about 25 µm or less, opening 511 may be too small to allow bubbles to escape easily, which may lead to reduction in etching uniformity.

Moreover, first metal layer 510 may experience deformation due to stress release effects from a wet etching process. For example, first metal layer 510 may be caused to cave in or otherwise deviate from a planar shape due to effects from a wet etching process etching away part of base layer 500 that may serve as a support to first metal layer 510.

A wet etching process may also limit flexibility in design. For example, because wet etching may be sensitive to surface topology, additional processing of base layer 500 may be needed to prepare for wet etching. Prior to performing wet etching, a bottom surface of base layer 500 may be polished to provide a uniform surface. However, the removal of material due to polishing may require that base layer 500 be provided with a greater thickness as a precursor material. Performing an elaborate polishing process to adjust base layer 500 to an appropriate thickness may dramatically affect yield.

Thus, in the process of FIG. 3, for example, forming opening 305 by applying chemical etchant 350 as in steps A6 and A7 may cause opening 305 to be formed with low uniformity, and may have adverse effects on first metal layer 310.

To reduce the possibility of abnormalities in forming opening 305, size of opening 305 may be set to a predetermined size or larger. For example, shelter material 340 may be formed with opening 341 that is large enough to guarantee that opening 305, which may serve as a clearance hole, will be fully formed as a result of wet etching. That is, the size of opening 305 may be set to be large enough that an opening is formed to communicate with opening 311. In some embodiments, a diameter of opening 305 may be set to about 150 μm when a diameter of opening 311 is set to about 25 μm.

However, a drawback to setting a size of opening 305 to be larger to accommodate for wet etching effects may be that the strength of first metal layer 310 may decrease. For example, in some embodiments, it may be desirable to set a diameter of a clearance hole, such as opening 305, to be about 65 μM when a diameter of a first opening, such as opening 311, is set to about 25 μm to provide structural strength. Therefore, setting a diameter of opening 305 to be larger to account for wet etching effects may involve a trade-off in structural strength. This may result in significant design constraints when a thickness of first metal layer 310 is thin, for example on the order of 1 μm, due to structural concerns of first metal layer 310 in the vicinity of opening 311.

Some embodiments of the present disclosure may provide a method for forming second hole in a substrate that may be useful as a clearance hole and that may address drawbacks of a wet etching process.

Figure 7:
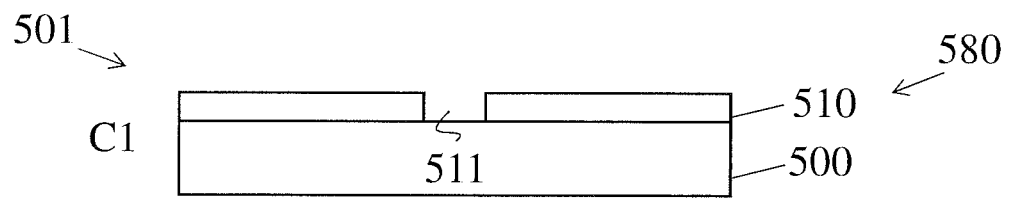
FIG. 7 illustrates an exemplary method of forming a second opening in a workpiece, consistent with embodiments of the present disclosure.
Figure 7:
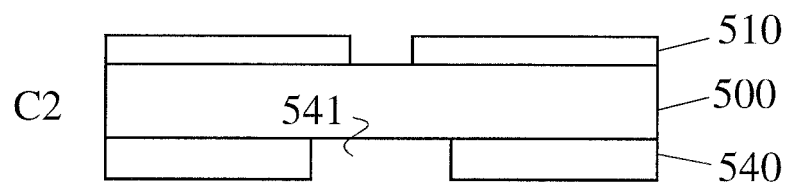
Figure 7:
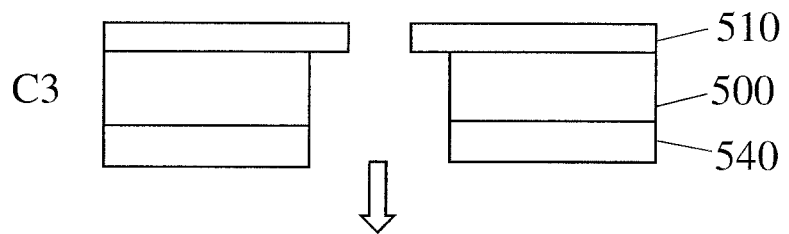
Figure 7:
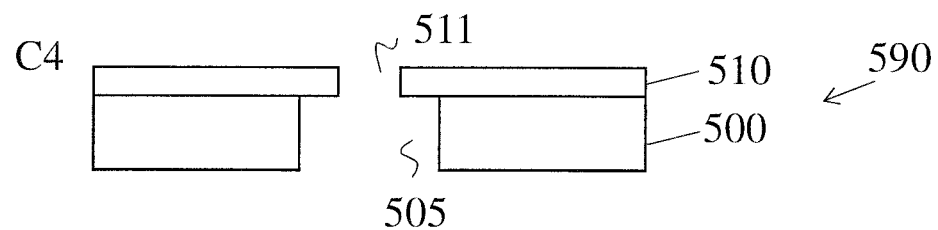

Reference is now made to FIG. 7, which illustrates a method of forming an opening, consistent with embodiments of the present disclosure. The method of FIG. 7 may include forming structures using lithography, etching, or other processes.

In step C1, substrate 501 may be provided. Step C1 may follow step B7 discussed above with reference to FIG. 5. Thus, step C1 may begin with structure 580 that may serve as a precursor for forming a second hole.

In step C2, a shelter material 540 may be provided on a bottom side of base layer 500. The bottom side of base layer 500 may be opposite from the side adjacent to first metal layer 510. Providing shelter material 540 may include applying and patterning a photoresist on base layer 500.

Providing shelter material 540 may include coating a photoresist material on base layer 500, heating substrate 501, and transferring a pattern to the photoresist by photolithography, similar to that discussed above for mask layer 320 and mask layer 520. Before or after performing photolithography, further processing may be performed, such as pre-baking or post-baking. Furthermore, in some embodiments, shelter material 540 may be provided completely covering substrate 501 except for opening 541. For example, in some processing steps, substrate 501 may be completely immersed in an etching solution and thus, shelter material 540 may be configured to cover all sides of substrate 501 to protect from etching.

As shown in FIG. 7, at step C2, shelter material 540 may be formed with an opening 541 that may be formed by photolithography. Opening 541 may include a hole having round edges. Opening 541 may be larger than opening 511 formed in first metal layer 510. For example, a round hole that may be included in opening 541 may have a diameter larger than that of a round hole that may be included in opening 511.

In step C3, an electrochemical etching process may be performed to remove material from base layer 500. Electrochemical etching, as shall be discussed in further detail below, may involve use of a solution comprising an electrolyte, an anode, and a cathode. Electrochemical etching of a workpiece may cause material of the workpiece to be removed. Because shelter material 540 may be formed with opening 541, portions of base layer 500 not covered by shelter material 340 may be exposed to the solution and may be removed. Electrochemical etching may proceed until the entire thickness of a portion of base layer 500 is etched through, thereby forming opening 505 in base layer 500. Opening 505 may communicate with opening 511. Opening 505 may include a clearance hole having round edges around its circumference on the bottom side of substrate 501.

In step C4, shelter material 540 may be removed. Step C4 may include development. Step C4 may include using a developer, such as acetone, to remove shelter material 540. Step C4 may include a process similar to that included in step A5 to remove mask layer 320, or in step A7 to remove shelter material 340.

In the process shown in FIG. 7, a structure having a first layer with a first opening and a second layer with a second opening may be formed. The second opening may be larger than the first opening, such that an undercut is formed. The structure formed by the process of FIG. 7 may be used as an aperture 590.

Reference is now made to FIG. 8, which illustrates an exemplary electrochemical etching process, consistent with embodiments of the present disclosure. Step C3 as discussed above with respect to FIG. 7 may include the following. Substrate 501 may be immersed in a bath 650 containing a solution 601. A plate 600 may also be immersed in bath 650. Plate 600 may be formed of the same material as base layer 500. Base layer 500 of substrate 501 and plate 600 may be electrically connected to a power supply 690. Solution 601 may include an electrolyte such that ions are mobile in solution 601.

When power supply 690 is turned on, electrolysis may occur, and thus the electrochemical etching process may be driven. Base layer 500 of substrate 501 may act as an anode and may donate electrons to the power supply 690, while plate 600 may act as a cathode at the opposite end of power supply 690 and may receive electrons. As an electrolytic reaction proceeds, at the anode, atoms of the material of base layer 500 may give up electrons and dissolve into the adjacent electrolytic solution as cations 550. Meanwhile, at the cathode, plate 600 may receive electrons through power supply 690 and cations 550 may be attracted to plate 600. Cations 550 from base layer 500 may travel through solution 601 and may attach to plate 600 as cations 550 accept electrons from plate 600. Thus, material from base layer 500 may be removed.

While FIG. 8 shows substrate 501 having a single opening being etched, it will be understood that substrate 501 may include an array of structures that may be etched simultaneously. Thus, substrate 501 shown in FIG. 8 may represent just one portion of a larger substrate that includes a plurality of first openings (e.g., such as opening 511 of FIG. 7) and a shelter material that includes a plurality of openings (e.g., such as opening 541 of FIG. 7). Thus, there may be a plurality of structures that may be etched together to become a plurality of second openings, such as opening 505. Furthermore, substrate 501 may be covered on multiple sides by shelter material 540, or by other materials. For example, base layer 500 may be sealed at its lateral sides.

In some embodiments, solution 601 may include 85% aqueous solution of phosphoric acid at a 14:10 volume ratio. It will be understood that other solutions and concentrations may be used depending on, for example, the type of material of base layer 500 and plate 600, environmental conditions, among other things.

An electrochemical etching process may exhibit various benefits relative to a wet etching process, especially for a metal base layer. For example, etching rate may be more uniform. Thus, compared to a wet etching process that may require forming holes of wide diameter to ensure that openings are formed all the way through base layer 500, holes of smaller diameter may be formed. Furthermore, holes may be formed in base layer 500 that have a uniform radius around an entire circumference of the hole. That is, a hole formed in base layer 500 may be substantially circular when viewed from a bottom side, such as in FIG. 2C. Additionally, electrochemical etching may have superior controllability as compared to a wet etching process. For example, parameters such as current supply, pulse width, and duty cycle of power supplied from power supply 690, which may have effects on resulting structures and may be controlled to a fine degree. As a result, for example, improved uniformity in resulting structures may be achieved.

Figure 9A:
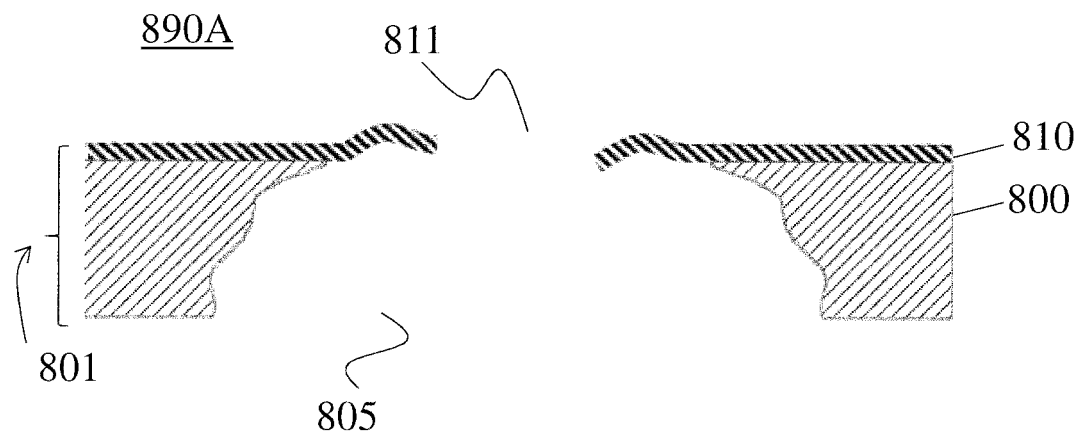
FIG. 9A and FIG. 9B are views of exemplary configurations of an aperture, consistent with embodiments of the present disclosure.

Using electrochemical etching, a process of forming a second hole in a workpiece that includes a first layer with a first opening may be achieved with high consistency and repeatability. Furthermore, structures may be achieved with consistent surface topology and without experiencing significant deformation. FIG. 9A shows a comparative example of an aperture 890A formed using chemical wet etching. Aperture 890A includes a substrate 801 formed of a base layer 800 and a first metal layer 810. As discussed above, adverse effects of wet etching may cause irregular structures to be formed. Irregular structures may include, for example, first metal layer 810 that deviates from a flat planar shape, a first opening 811 that deviates from a round, circular hole, and a wide second opening 805 in base layer 800 that is formed with rough sidewalls.

Figure 9B:
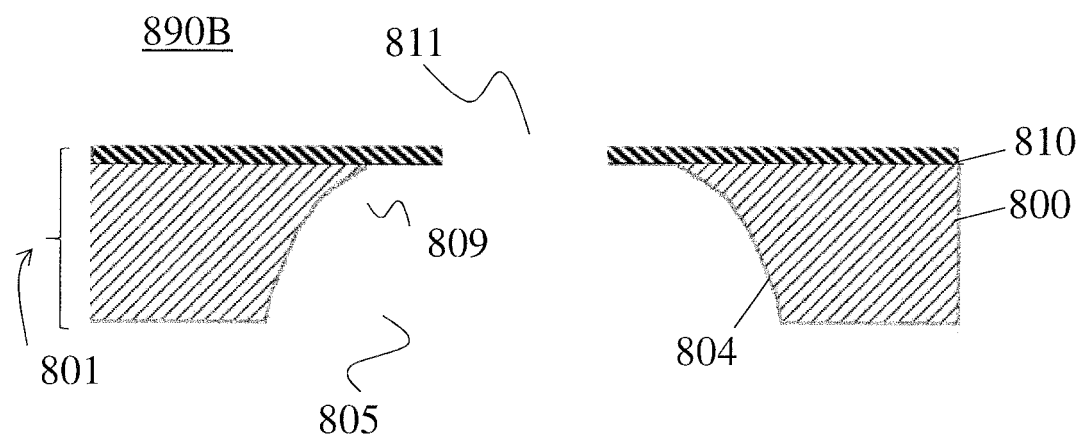

FIG. 9B shows an example of an aperture 890B formed using electrochemical etching. Aperture 890B may be formed with first metal layer 810 that remains flat. Furthermore, second opening 805 may be formed with sidewalls 804 that gradually narrow from the bottom of base layer 800 to the top side thereof adjacent to first metal layer 810. Base layer 800 may include a smooth corner 809 that may connect to first metal layer 810. In some embodiments, sidewalls 804 may form a taper between the bottom side to the top side of base layer 800. Gently curving or tapered sidewalls may be advantageous for providing strength to first metal layer 810 while maintaining relatively small sized openings. Furthermore, a tunneling effect may be reduced or eliminated when aperture 890B is used in an imaging system, for example.

An electrochemical etching process may include forming smooth corner 809 at an interface between base layer 800 and first metal layer 810. For example, parameters of the electrochemical etching process may be determined so that a desired structure may be formed. Parameters may include, for example, operating power supply 690 at a first power level for a first period and operating power supply 690 at a second power level different from the first power level for a second period. Power supply 690 may be cycled between the first power level and the second power level. Cycling power supply 690 may be useful to generate an agitation effect and may be helpful to produce consistent structures with smooth features.

In some embodiments, a method may include setting a size of opening 505 to a predetermined size or less. For example, opening 505 may be a circular hole that is set to have a diameter of 65 μm or less. Setting of a size of opening 505 may be performed by forming opening 541 in shelter material 540 at the predetermined size, or less, for example, and then performing electrochemical etching. Similar to the example discussed above with respect to FIG. 2A, the ratio D2/D1 may be set within a predetermined range. For example, the ratio D2/D1 may be set to 2.6 or less. Because an etch rate using electrochemical etching may be substantially uniform, a process using electrochemical etching may reliably create small holes at the predetermined size, or less.

Figure 10:
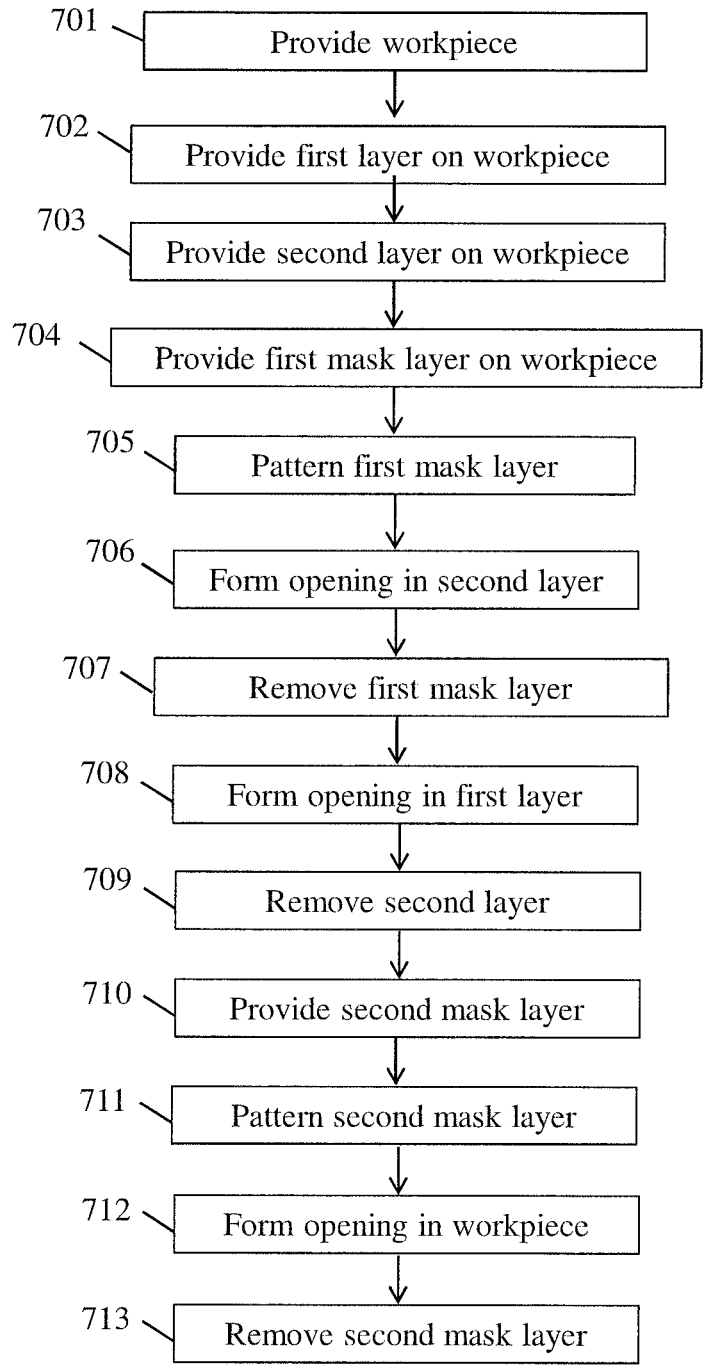
FIG. 10 is a flowchart representing a method of forming a first opening and a second opening in a workpiece, consistent with embodiments of the present disclosure.

Reference is now made to FIG. 10, which shows a method 700 of processing a workpiece that may be useful in forming a structure, such as aperture 590. The flowchart of FIG. 10 shows method 700 including a plurality of steps that may correspond with steps shown in FIG. 3, FIG. 5, or FIG. 7.

In step 701, a workpiece may be provided. The workpiece may include base layer 500 that may make up a part of substrate 501.

In step 702, a first layer may be provided on the workpiece. For example, first metal layer 510 may be provided on top of base layer 500. Step 702 may include sputtering a material, such as metal on the workpiece. Step 702 may include applying an adhesion layer prior to applying the first layer to the workpiece. In some embodiments, other methods of deposition may also be used.

In step 703, a second layer may be provided on the workpiece. For example, second metal layer 515 may be provided on top of first metal layer 510. Step 703 may include sputtering a material, such as metal on the workpiece.

In step 704, a first mask layer may be provided on the workpiece. For example, mask layer 520 may be provided on top of second metal layer 515. Step 704 may include coating a liquid material, such as a liquid photoresist on the workpiece.

In step 705, the first mask layer may be patterned. For example, mask layer 520 including a photoresist may be exposed to a light source through a light-blocking mask pattern so that the photoresist is selectively cured in exposed portions. Then, un-cured portions of the mask layer may be removed by development. Thus, the mask pattern may be transferred to the mask layer. Step 705 may include forming opening 521 in mask layer 520.

In step 706, an opening may be formed in the second layer. For example, a portion of second metal layer 515 may be removed. Step 706 may include etching, such as a wet chemical etching process. In step 706, the pattern of mask layer 520 may be transferred to second metal layer 515.

In step 707, the first mask layer may be removed. For example, mask layer 520 may be dissolved by a wet method or a dry method of development.

In step 708, an opening may be formed in the first layer. For example, a portion of first metal layer 510 may be removed. Step 708 may include etching the workpiece with an ion beam. For example, ion beam 330 may be applied to substrate 501 to form opening 511 in first metal layer 510. The second layer may act as a mask for ion beam etching of the underlying first layer.

Step 707 of removing the first mask layer may occur before step 708 of forming the opening in the first layer. Accordingly, ion beam etching may be carried out after the first mask layer has already been removed. Thus, a photoresist material that may be included in the first mask layer will not be bombarded by the ion beam, and a normal method of removing the first mask layer may be used, such as development by acetone or O2 plasma. Because photoresist included in the first mask layer is not bombarded by an ion beam, it may avoid being hardened, and therefore, organic residues may be avoided.

In step 709, the second layer may be removed. For example, second metal layer 515 may be removed from substrate 501. Step 709 may include etching, such as a wet chemical etching process. Wet chemical etching may clean the surface of the first layer. Furthermore, because a material of the second layer may be metal, or another material resistant to ion beam etching, formation of organic residues on the first layer may be avoided. Thus, using the second layer, such as second metal layer 515, as a mask for ion beam etching may allow a cleaner surface of the first layer to be produced relative to, for example, a process that directly applies dry etching to a photoresist layer.

Continuing in the flowchart of FIG. 10, in step 710, a second mask layer may be provided on the workpiece. For example, with reference to FIG. 3, shelter material 340 may be provided on the bottom side of a substrate, such as substrate 301, or similarly, substrate 501 (see FIG. 5). Step 710 may include coating a liquid material, such as a liquid photoresist on the workpiece.

In step 711, the second mask layer may be patterned. For example, shelter material 340 including a photoresist may be exposed to a light source through a light-blocking mask pattern so that the photoresist is selectively cured in exposed portions. Then, un-cured portions of the second mask layer may be removed by development. Thus, the mask pattern may be transferred to the second mask layer. Step 710 may include forming an opening in the second mask layer.

In step 712, an opening may be formed in the workpiece. For example, opening 305 may be formed (see FIG. 3), or opening 505 may be formed (see FIG. 7). Step 712 may include etching, such as a wet chemical etching process. In some embodiments, step 712 may include electrochemical etching. In step 712, the pattern of the second mask layer may be transferred to the workpiece.

In step 713, the second mask layer may be removed. For example, shelter material 340 may be removed (see FIG. 3 or FIG. 7). Step 713 may include development.

The processing of FIG. 10 may be carried out sequentially in the order illustrated. In some embodiments, the processing of FIG. 10 may be carried out in a different order. For example, step 707 of removing the first mask layer may occur after step 708 of forming the opening in the first layer. Accordingly, ion beam 330 may be applied to substrate 501 while mask layer 520 is still on substrate 501. Thus, ion beam etching may be applied directly to the first mask layer. However, because second metal layer 515 may be provided on top of first metal layer 510, first layer 510 may be protected from residues. Residues formed due to mask layer 520 being exposed to ion beam etching may be formed on second metal layer 515. Second layer 515 may be later removed, for example as in step 709. Accordingly, any residues that may be formed on second layer 515 may be removed along with removal of second layer 515. Thus, the first layer may be formed with an opening without having residues left on the first layer. In this manner, second metal layer 515 may act as a sacrificial layer.

Furthermore, some steps may be combined. For example, step 706 of forming the opening in the second layer and step 707 of removing the first mask layer may be combined. As discussed above with respect to FIG. 5, etchant 530 may include a developer and may be applied to substrate 501 when mask layer 520 and second metal layer 515 are both still on substrate 501. Thus, mask layer 520 may be removed together with the etching process that forms opening 516 in second metal layer 515.

Furthermore, some steps in the process of FIG. 10 may be omitted, or additional steps may be added. For example, a step of flipping over the workpiece may be added, for example, between steps 709 and 710.

Aperture 590 that is formed by methods consistent the present disclosure may have numerous advantages. Aperture 590 may include first metal layer 510 that may be made thinner than comparable aperture structures. Thus, negative effects on imaging, such as stigmatism, may be reduced. Meanwhile, base layer 500 may be provided that may provide structural support for first metal layer 510. Thus, compared to a floating layer, first metal layer 510 may have improved strength and durability. Accordingly, first metal layer 510 may remain substantially in plane with little to no deviations out of plane. Furthermore, first metal layer 510 may include opening 511 that may have a uniform shape with little to no deviations out of round. Additionally, opening 511 may be formed without leaving residues that may affect performance of the structure to be used as aperture 590. A stable and clean etching result may be achieved by using second metal layer 515, among other things. Moreover, processing for forming opening 511 may be insensitive to the type of photoresist used in mask layer 520, or the thickness of first metal layer 510. Meanwhile, high-quality transfer of a pattern including a round edge, such as that of opening 511, may be achieved.

Additionally, aperture 590 may be formed with base layer 500 having sidewalls 504 that are substantially uniform around an entire circumference of opening 505. Shapes such as a circular, round holes for opening 511 and opening 505, and a flat planar sheet layer for first metal layer 510 may be achieved with high regularity and repeatability. Furthermore, aperture 590 may have improved structural integrity and improved resistance to stresses, which may be beneficial for achieving a long service lifetime.

Aperture 590 may be a part of an adjustable aperture array. For example, a plurality of openings may be provided in a single plate that may so that beam current may be adjusted by switching to another one of the plurality of openings. An aperture plate may be adjustable by virtue of having multiple aperture holes aligned in a sliding direction so that when the aperture is moved along the sliding direction, a different one of the aperture holes may be aligned with a primary electron beam optical axis. Examples of an adjustable aperture array are discussed in, for example, U.S. patent application Ser. No. 16/053,636.

Aperture 590 may also be used as a beamlet-forming mechanism that may include a plurality of trimming apertures. Examples of a beamlet forming mechanism are discussed in, for example, U.S. Patent Application No. 62/716,832.

The embodiments may further be described using the following clauses:

1. A method comprising:
   forming a first layer on a first side of a base layer;
   forming a second layer on the first layer, wherein a material of the second layer includes metal;
   forming an opening in the second layer;
   forming an opening in the first layer by first etching; and
   removing the second layer.

2. The method of clause 1, further comprising:
   forming a mask layer on the second layer;
   forming an opening in the mask layer; and
   etching the second layer through the mask layer.

3. The method of clause 2, wherein
   a material of the mask layer includes photoresist; and
   forming the opening in the first layer by the first etching includes dry etching.

4. The method of clause 2 or clause 3, further comprising:
removing the mask layer before forming the opening in the first layer.
5. The method of clause 2 or clause 3, further comprising: removing the mask layer after forming the opening in the first layer.
6. The method of any of clauses 1-5, further comprising: forming an opening in the base layer, the opening in the base layer being larger than the opening in the first layer.
7. The method of clause 6, wherein forming the opening in the base layer comprises:
forming a third layer on a second side of the base layer, the second side being opposite to the first side;
forming an opening in the third layer; and
etching the base layer through the third layer.
8. The method of any of clauses 1-7, wherein a material of first layer is more resistant to the first etching than the material of the second layer.
9. The method of clause 8, wherein the material of the first layer is platinum.
10. The method of any of clauses 1-9, wherein the material of second layer is molybdenum.
11. The method of any of clauses 1-10, wherein a material of the base layer is molybdenum.
12. The method of any of clauses 1-11, wherein a thickness of the second layer is greater than a thickness of the first layer.
13. The method of any of clauses 1-12, wherein the base layer is a planar layer.
14. The method of any of clause 1-13, wherein the base layer, the first layer, and the second layer are planar layers that are parallel to one another.
15. A workpiece obtained by the method of clause 1.
16. A workpiece that includes an aperture obtained by the method of clause 5.
17. A method of forming an opening in a workpiece, the workpiece comprising a first layer on a first side of a base layer, the first layer including a first opening, and a second layer on a second side of the first layer, the second side being opposite the first side and second layer including a second opening, the method comprising:
forming an opening in the base layer by electrochemical etching.
18. The method of clause 17, further comprising
forming a smooth corner at an interface between the base layer and the first layer.
19. The method of clause 17 or clause 18, further comprising
setting a size of the opening in the base layer to a predetermined size or less.
20. The method of clause 6 or clause 7, further comprising:
forming the opening in the base layer by electrochemical etching.
21. The method of clause 1, wherein the second layer with the formed opening is used as a mask for the first layer during the first etching.
22. The method of clause 1, wherein the aperture device is configured to limit an electron beam current in an electron beam inspection system.
23. An aperture device comprising
a first layer comprising a first opening; and
a base layer comprising a second opening,
wherein the first opening is formed by:
forming the first layer on a first side of the base layer;
forming a second layer on the first layer, wherein a material of the second layer includes metal;
forming an opening in the second layer;
forming an opening in the first layer by first etching;
removing the second layer; and
wherein the second opening is formed by using electrochemical etching.
24. The aperture device of clause 23, wherein the base layer comprises a metal material and the first layer comprises a metal material.
25. The aperture device of clause 23, wherein the base layer and the second layer each comprise molybdenum, and wherein the first layer comprises platinum.
26. The aperture device of clause 23, wherein the second opening is larger than the first opening.

Although the present disclosure explains some exemplary embodiments, it is to be understood that other modifications and variation may be made. For example, although a structure has been discussed with reference to application as an aperture, structures and methods of the present disclosure may be similarly applied to, for example, a lens, or other particle-optical elements. A lens may include a plate with an opening through which a beam passes. The plate may be excited by application of electrical voltage. For example, first metal layer 510 may act as an electrode in an electrostatic lens. Furthermore, although a charged particle optical system has been discussed, structures, systems, and methods of the present disclosure may be applicable to other technical fields, such as microstructure manufacturing.

The invention claimed is:
1. A method of fabricating an aperture device comprising a base layer and a first layer, the method comprising:
forming the first layer on a first side of the base layer, wherein a material of the base layer or a material of the first layer includes metal;
forming a second layer on the first layer, wherein a material of the second layer includes metal;
forming an opening in the second layer;
forming an opening in the first layer by first etching;
removing the second layer; and
forming an opening in the base layer by using electrochemical etching.
2. The method of claim 1, wherein the second layer with the formed opening is used as a mask for the first layer during the first etching.
3. The method of claim 1, wherein the aperture device is configured to limit an electron beam current in an electron beam inspection system.
4. The method of claim 2, further comprising:
forming a mask layer on the second layer;
forming an opening in the mask layer; and
etching the second layer through the mask layer.
5. The method of claim 4, wherein
a material of the mask layer includes photoresist; and
forming the opening in the first layer by the first etching includes dry etching.
6. The method of claim 4, further comprising:
removing the mask layer before forming the opening in the first layer; or
removing the mask layer after forming the opening in the first layer.
7. The method of claim 1, wherein the opening formed in the base layer is larger than the opening formed in the first layer.
8. The method of claim 1, wherein forming the opening in the base layer comprises:
forming a third layer on a second side of the base layer, the second side being opposite to the first side;
forming an opening in the third layer; and
etching the base layer through the third layer.

9. The method of claim 1, wherein the material of the first layer is platinum.

10. The method of claim 1, wherein the material of the second layer is molybdenum.

11. The method of claim 1, wherein a material of the base layer is molybdenum.

12. An aperture device comprising
a first layer comprising a first opening; and
a base layer comprising a second opening, wherein a material of the base layer or a material of the first layer includes metal,
wherein the first opening is formed by:
forming the first layer on a first side of the base layer;
forming a second layer on the first layer, wherein a material of the second layer includes metal;
forming an opening in the second layer;
forming an opening in the first layer by first etching;
removing the second layer; and
wherein the second opening is formed by using electrochemical etching.

13. The aperture device of claim 12, wherein the base layer comprises a metal material and the first layer comprises a metal material.

14. The aperture device of claim 12, wherein the base layer and the second layer each comprise molybdenum, and wherein the first layer comprises platinum.

15. The aperture device of claim 12, wherein the second opening is larger than the first opening.

* * * * *